United States Patent [19]

Nickerson

[11] 3,838,349

[45] Sept. 24, 1974

[54] BAND LIMITED FM DETECTOR

[75] Inventor: Douglas W. Nickerson, Hoffman Estates, Ill.

[73] Assignee: Motorola, Inc., Chicago, Ill.

[22] Filed: June 1, 1973

[21] Appl. No.: 365,920

[52] U.S. Cl. ................. 329/103, 307/233, 328/112, 328/140, 329/50, 329/106

[51] Int. Cl. ............................ H03c 3/02, H03c 3/18

[58] Field of Search ............ 329/102, 103, 50, 110, 329/106, 112, 145; 307/233, 234, 218; 328/111, 112, 140

[56] References Cited

UNITED STATES PATENTS

| | | | |
|---|---|---|---|
| 2,984,789 | 5/1961 | O'Brien | 307/234 X |
| 3,454,788 | 7/1969 | Tyler et al. | 307/234 |
| 3,500,369 | 3/1970 | Kellam | 307/234 X |
| 3,526,784 | 9/1970 | Beydler et al. | 307/218 |
| 3,573,642 | 4/1971 | Yackish | 329/50 X |
| 3,611,157 | 10/1971 | Hughes | 307/234 X |

*Primary Examiner*—Alfred L. Brody
*Attorney, Agent, or Firm*—Eugene A. Parsons; Vincent J. Rauner

[57] ABSTRACT

The output IF signal of an FM receiver is coupled to a coincidence gate, including a pair of transistors having common connected collectors and emitters, and also used to actuate a timer which provides a positive output pulse for each positive going excursion of the FM signal. The timer output is coupled to a second input of the coincidence gate and the gate provides an output when both of the applied signals are low. This signal is then applied to an inverter to provide a signal which has a relatively high duty cycle and which, after passing through a low pass filter, varies in direct proportion to the frequency of the IF signal.

5 Claims, 7 Drawing Figures

PATENTED SEP 24 1974

3,838,349

BAND LIMITED FM DETECTOR

BACKGROUND OF THE INVENTION

In most FM receivers and other electronic equipment it is becoming more desirable to integrate the circuits so that the cost and size may be greatly reduced. Thus, pulse counter type band limited FM detectors have been developed. However, it is desirable to provide a band limited FM detector which produces an output signal that varies directly with changes in frequency of the FM signal and which has a high degree of quieting sensitivity. In addition, the signal must be of sufficient amplitude to drive following stages.

SUMMARY OF THE INVENTION

The present invention pertains to a band limited detector for a frequency modulated wave which alternates between first and second voltage levels including a timer connected to receive said wave and develop an enabling signal varying from a first voltage level to a second voltage level each time the wave varies from a first voltage level to a second voltage level, and a coincidence gate connected to receive the FM wave at one input and the timer enabling signal at the other input and supply an output signal during the coincidence of the two signals. The output signal of the coincidence gate is inverted to provide a signal which varies directly with changes in frequency of the FM wave and which has an increased duty cycle so that the signal may be applied to an active low pass filter or integrating network at low voltage. The coincidence gate is the type incorporating a pair of transistors having common connected collectors and emitters so that noise which triggers the timer continuously cannot pass therethrough.

It is an object of the present invention to provide an improved band limited FM detector.

It is a further object of the present invention to provide a band limited FM detector which has enhanced quieting features.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PRIOR ART

Figure 1:
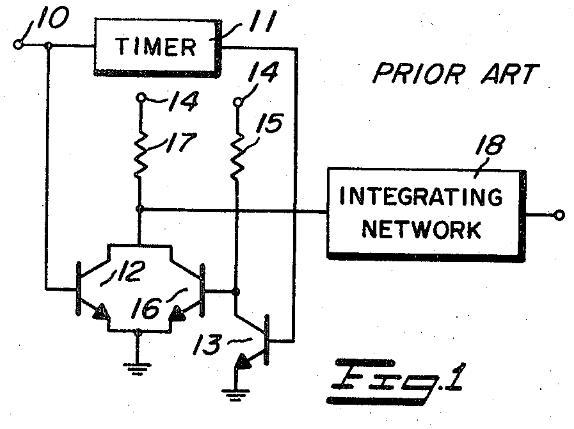
FIG. 1 is a schematic view of a prior art band limited FM detector.

Referring specifically to FIG. 1, a schematic diagram of a prior art band limited FM detector is illustrated, which detector is described in detail in U.S. Pat. No. 3,573,642, entitled "Band Limited FM Detector," issued to Thomas M. Yackish on Apr. 6, 1971 and assigned to the same assignee. In this detector an IF frequency modulated wave is applied to an input 10, which supplies the wave to a timer 11 and to the base of an NPN type transistor 12. The FM wave alternates between first and second voltage levels with a 50 percent duty cycle, since it is simply an amplified and limited signal. The timer develops an enabling signal for a fixed predetermined time interval each time the timer is actuated by the transition of the FM wave from the first voltage level to the second voltage level. The enabling signal from the timer 11 is applied to the base of an NPN type transistor 13, the emitter of which is grounded and the collector of which is connected to a source of positive potential 14 through a resistor 15. The collector of the transistor 13 is also connected to the base of an NPN type transistor 16, the collector of which is connected to the collector of the transistor 12 and the emitter of which is connected to the emitter of the transistor 12. The common connected emitters of the transistors 12 and 16 are also connected to ground and the common connected collectors are connected through a resistor 17 to the positive source of potential 14. The collectors are also connected to an integrating network 18 which supplies an analog output signal to subsequent circuitry.

In the operation of the circuit of FIG. 1, the timer 11 produces a positive enabling pulse for each low to high transition of the FM signal at the input thereof. This enabling pulse is inverted by the transistor 13 and applied to the base of the transistor 16. Since the gate formed by transistors 12 and 16 only provides an output to the integrating network 18 when both bases are low, an output is produced during the time that the low portion of the FM input wave and the enabling pulse coincide. Since the enabling pulse is a fixed predetermined time interval and since it begins with the low to high transition of the FM input wave, within certain limits higher frequencies produce output pulses with a greater duty cycle and lower frequencies produce output pulses with a lower duty cycle. These trains of output pulses pass through the integrating network 18 and are integrated to produce analog signals. However, all of the duty cycles within the limited frequency range of this detector are relatively low, below 50 percent. Thus, for circuits utilizing low power supply voltages, in the order of 1 or 2 volts, this detector circuit does not supply a sufficient output signal to operate subsequent stages of like conductivity type.

Noise at the output of the FM detector is composed essentially of two components, i.e., noise which results from the IF noise lying within the bandwidth of the detector, which is detected by the detector, and IF noise that is sufficiently low in frequency to feed through the integrating network, which bypasses the detector. As the strength of a signal applied to the detector increases the noise decreases and the detected noise decreases relatively rapidly, however, the low frequency noise at the output of the detector decreases at a slower rate. Thus, it is essential to good quieting in a receiver that the low frequency noise bypassing the detector be reduced to a minimum. In the detector of FIG. 1 the timer 11 supplies positive pulses to the transistor 13, which supplies negative pulses to the transistor 16 of the gate, whenever positive going pulses (signals or noise) of sufficient amplitude are applied to the input 10. With the transistor 16 biased into nonconduction by the negative pulses, the gate is controlled by transistor 12 and signals and noise are free to pass therethrough. Thus, the gate provides a bypass for low frequency noise and the quieting of the receiver is reduced.

Figure 2:
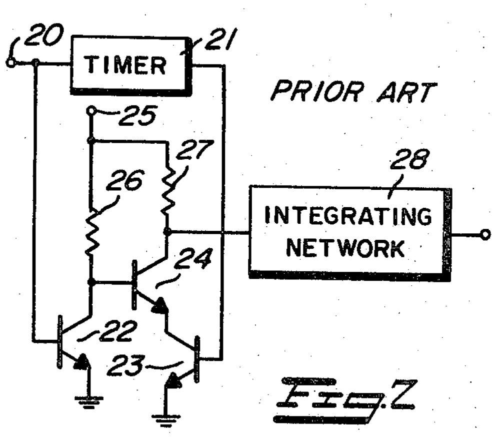
FIG. 2 is a schematic view of another prior art band limited FM detector.

Referring to FIG. 2, a second prior art circuit is illustrated which has an input terminal 20 adapted to receive an FM wave similar to that described for FIG. 1. The terminal 20 is connected to a timer 21 and to the base of an NPN type transistor 22. The output of the timer 21 is connected to the base of an NPN type transistor 23 the collector of which is connected to the emitter of an NPN type transistor 24. The emitters of the transistors 22 and 23 are grounded and the collectors of the transistors 22 and 24 are connected to a suitable source of positive potential at a terminal 25 by means of resistors 26 and 27, respectively. The collector of the transistor 22 is also connected to the base of the transistor 24 and the collector of the transistor 24 is also connected to an integrating network 28.

In the operation of the circuit of FIG. 2, the timer 21 produces an enabling signal similar to that described for the timer 11 of FIG. 1 and in the same relation to the input FM signal. The pulses from the timer 21 are applied to the base of the transistor 23 which conducts when the pulses are positive. Since the transistors 23 and 24 are in series the transistor 24 is free to conduct when the transistor 23 is conducting. The transistor 22 conducts when the input FM wave is positive. Thus, when the positive timing pulse is applied to the base of the transistor 23 any signal at the terminal 20 feeds through the transistors 22 and 24 to the low pass filter 28. The gate, therefore, provides a bypass for low frequency noise and the quieting of the receiver is reduced.

DESCRIPTION OF THE PREFERRED EMBODIMENT

Figure 3:
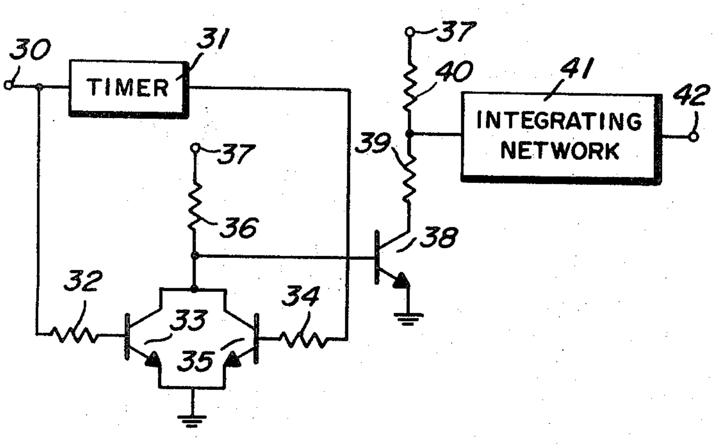
FIG. 3 is a schematic view of an embodiment of the present band limited FM detector.
Figure 4:
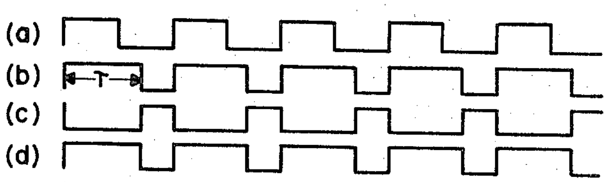
FIGS. 4(*a*), 4(*b*), 4(*c*) and 4(*d*); 5(*a*), 5(*b*), 5(*c*) and 5(*d*); 6(*a*), 6(*b*), 6(*c*) and 6(*d*); and 7(*a*), 7(*b*), 7(*c*) and 7(*d*) are voltage waveforms illustrating the operation of the band limited FM detector.

Referring to FIG. 3, an input terminal 30 is adapted to have applied thereto a frequency modulated wave which alternates between first and second voltage levels. Typical FM waves are illustrated in FIGS. 4(*a*), 5(*a*) and 6(*a*). The FM wave at the terminal 30 is applied to a timer 31 and, through a resistor 32 to the base of an NPN type transistor 33. The timer 31 is the type which develops an enabling signal for each transition of the FM wave from the first to the second voltage level applied to the terminal 30 as described in the previously referred to prior art U.S. Pat. No. 3,573,642. The enabling signal is a positive pulse having a leading edge coinciding with the transition of the FM wave and continuing for a fixed predetermined time interval. The timer may be the type which will not react to a second transition of the FM wave during the fixed predetermined time interval, or until the timing cycle has been completed, or it may be the type which will reset for each transition (from the first to the second voltage level) of the FM wave regardless of the time elapsed. Typical enabling signals from the timer 31 are illustrated in FIGS. 4(*b*), 5(*b*) and 6(*b*). The fixed predetermined time interval is indicated as $\tau$ in the figures.

The enabling signal from the timer 31 is applied, through a resistor 34, to the base of an NPN type transistor 35. The emitters of the transistors 33 and 35 are connected in common and to ground and the collectors are connected in common and through a resistor 36 to a source of positive potential at a terminal 37. The common connected collectors of the transistors 33 and 35 are also connected to the base of an NPN type transistor 38. The emitter of the transistor 38 is connected to ground and the collector is connected through two series connected resistors 39 and 40 to the positive source of potential at terminal 37. The output signal from the transistor 38 is obtained at the junction of the resistors 39 and 40 and is applied to an integration network 41, the output of which is available at a terminal 42 for use in subsequent circuits.

Figure 5:
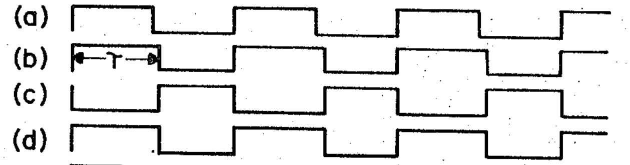
Figure 6:
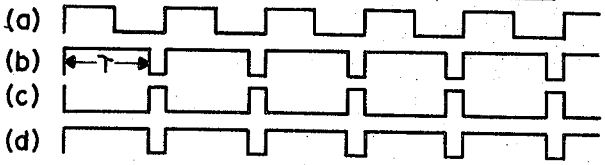

The transistors 33 and 35 form a coincidence gate which supplies a positive signal output at the common connected collectors only when the signals on both of the bases are low. FIG. 4(*a*) illustrates the input FM wave at an approximately mid-frequency and FIG. 4(*b*) illustrates the resulting enabling signal from the timer. FIG. 5(*a*) illustrates the input FM wave at a lower frequency and FIG. 5(*b*) illustrates the resulting enabling signal from the timer. FIG. 6(*a*) illustrates the input FM wave at a higher frequency and FIG. 6(*b*) illustrates the resulting enabling signal from the timer. It will be noted from the above-described figures that the coincidence of the input FM wave and the enabling signal at the first or lower level is less as the frequency increases. It should also be noted that the duty cycle of the resulting output signal from the coincidence gate, FIG. 4(*c*), 5(*c*) and 6(*c*) is less than 50 percent. This signal is applied to the base of the transistor 38, which operates as an inverter means, so that the signal at the collector is an inverse signal which has a duty cycle that increases as the frequency of the input FM wave increases and that is greater than 50 percent. Thus, the signal applied to the integrating network 41 is sufficient to provide an analog output signal at the terminal 42 for driving subsequent stages.

Figure 7:
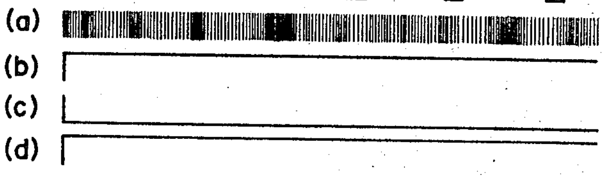

When the signal at the terminal 30 is primarily noise, generally depicted by FIG. 7(*a*), the enabling signal provided by the timer 31 is a substantially continuous positive pulse, depicted by FIG. 7(*b*). The application of this continuous positive pulse to the base of the transistor 35 produces continuous conduction therein and maintains the common connected collectors at a low potential, depicted in FIG. 7(*e*). Since the common connected collectors are at a low potential the noise applied to the base of the transistor 33 has no effect on the coincidence gate. When the signal at the terminal 30 is primarily an FM wave the signal passes through the detector in the prescribed manner. However, when the signal at the terminal 30 is both FM wave and IF noise, there is a tendency for noise to bypass the detector while the FM wave is passing therethrough. Since the improved detector has a maximum duty cycle of less than 50 percent and the average is generally about 25 percent, the average feed thru noise is reduced by approximately one third. Further, in the prior art detectors a positive going noise spike will trigger the timer and open the feed thru path so that the noise spike and subsequent noise can pass therethrough until the timer resets. In the improved detector a noise spike that occurs when the feed thru path is closed (transistor 35 is conducting) has no effect and if the noise spike occurs during the time the feed thru path is open (transistor 35 is nonconducting) it will trigger the timer 31 and close the feed thru path to itself and all subsequent noise until the timer 31 resets. Because pulses from the timer 31 close the coincidence gate, a bypass path for low frequency noise and the like is not provided and quieting of a receiver utilizing the new detector is improved.

When the signal applied to terminal 30 is primarily noise the output of the inverter means applied to the low pass filter 41, depicted by FIG. 7(*b*), is a continuous high signal which, if it exceeds the normal high excursion of desirable signals applied to the low pass filter, may be clamped by some convenient means (not shown) at or near the normal high to prevent impairing the operation of the low pass filter 41.

Thus, a band limited detector is disclosed which has a substantially enhanced quieting feature and which supplies an output signal of sufficient magnitude to drive subsequent stages. In addition, the circuit has the advantages of being simple and easily incorporated into integrated circuits.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A band-limited detector for a frequency-modulated wave which alternates between first and second voltage levels, with the frequency of alternation varying from a center frequency in a range between a lowest frequency and a highest frequency, such detector including in combination, timer means adapted to develop an enabling signal varying from a first voltage level to a second voltage level for a fixed predetermined time interval after actuation thereof, which time interval is within the range from one-half the period of the lowest frequency of the modulated wave to the period of the highest frequency of the modulated wave, means coupled to said timer means for receiving the frequency-modulated wave and for actuating said timer means in response to each transition of the frequency-modulated wave from the first voltage level to the second voltage level, a coincidence gate coupled to said timer means and receiving said enabling signal therefrom, means applying the frequency-modulated wave to said coincidence gate, said coincidence gate being responsive to said enabling signal and to the frequency-modulated wave to develop an output signal only during the coincidence of the first voltage level of said enabling signal and of the first voltage level of the frequency-modulated wave, inverter means coupled to said coincidence gate for providing an output signal in response to the output signal from said coincidence gate which is the inversion of the output signal from said coincidence gate; and means coupled to said inverter means and responsive to the output signal therefrom to develop a signal which is a function of the modulation of the frequency-modulated wave.

2. A band-limited detector as claimed in claim 1 wherein the timer means includes a resettable timer which is actuated for each first to second voltage level transition applied thereto.

3. A band-limited detector as claimed in claim 1 wherein the means coupled to the inverter means includes a low pass filter.

4. A band-limited detector as claimed in claim 1 wherein the coincidence gate means includes a pair of similar conductance type of transistors each having a collector, an emitter and a base and having common collector and emitter connections with the bases connected for receiving the frequency modulated wave and the enabling signal, respectively.

5. A band-limited detector as claimed in claim 4 wherein the inverter means is connected to the common collectors of the pair of transistors for receiving the output signal therefrom.

* * * * *